United States Patent
Nakahara et al.

(10) Patent No.: US 6,664,184 B2
(45) Date of Patent: Dec. 16, 2003

(54) METHOD FOR MANUFACTURING SEMICONDUCTOR DEVICE HAVING AN ETCHING TREATMENT

(75) Inventors: Miwako Nakahara, Yokohama (JP); Sukeyoshi Tsunekawa, Tokyo (JP); Kazuto Watanabe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/175,471

(22) Filed: Jun. 18, 2002

(65) Prior Publication Data

US 2003/0017701 A1 Jan. 23, 2003

(30) Foreign Application Priority Data

Jun. 18, 2001 (JP) ........................................ 2001-183719

(51) Int. Cl.[7] ........................................... H01L 21/4763
(52) U.S. Cl. ............................. 438/650; 438/3; 438/240
(58) Field of Search ..................... 438/3, 240, 642–643, 438/650, 686

(56) References Cited

U.S. PATENT DOCUMENTS 6,541,813 B1 * 4/2003 Niwa et al. ................. 257/310

FOREIGN PATENT DOCUMENTS

| JP | 06-283438 | 10/1994 |
|---|---|---|
| JP | 08-078396 | 3/1996 |
| JP | 09-246214 | 9/1997 |
| JP | 10-163178 | 6/1998 |
| JP | 10-209132 | 8/1998 |
| JP | 2000-183034 | 6/2000 |
| JP | 2000-183303 | 6/2000 |
| JP | 2000-200782 | 7/2000 |
| JP | 2000-223671 | 8/2000 |
| JP | 2001-284317 | 10/2001 |
| JP | 2001-284330 | 10/2001 |

* cited by examiner

Primary Examiner—Jey Tsai
(74) Attorney, Agent, or Firm—Townsend and Townsend and Crew LLP

(57) ABSTRACT

A pretreatment in which impurities containing carbon are removed from a conductor film formed on a substrate is performed prior to an etching treatment of the conductor film. In this pretreatment, a gas containing oxygen, nitrogen, or a nitrogen oxide is irradiated with ultraviolet rays or electromagnetic waves, and this gas is supplied to the substrate surface, which has been heated to a temperature of 200° C. or lower. This allows a semiconductor device having at least one type of conductor film selected from among a ruthenium film, a ruthenium oxide film, an osmium film, and an osmium oxide film to be manufactured inexpensively and at a high level of quality.

8 Claims, 9 Drawing Sheets

| Pretreatment method | Ruthenium etching rate [nm/min] | Resist etching rate [nm/min] | Ruthenium modification [oxidation, etc.] |
|---|---|---|---|
| UV irradiated $O_2$ gas | <5 | <20 | none |
| UV irradiated $N_2$ gas | <2 | <10 | none |
| Organic solvent wet treatment | <1 | >100 | none |

METHOD FOR MANUFACTURING SEMICONDUCTOR DEVICE HAVING AN ETCHING TREATMENT

BACKGROUND OF THE INVENTION

1. Field of the Invention

The present invention relates to a technique for manufacturing a semiconductor device, and more particularly relates to the fine working of at least one type of conductor film selected from among a ruthenium film, a ruthenium oxide film, an osmium film, and an osmium oxide film.

2. Description of the Related Art

In an effort to increase the capacity of DRAM cell capacitors, there have been attempts at forming the capacitor dielectric film of a DRAM cell from a multi-element oxide with a high dielectric constant (such as $BaSrTiO_3$). From the standpoint of the ease of working by dry etching, the use of ruthenium, ruthenium oxide, and the like has been studied for electrode materials combined with these multi-element oxides. The technique discussed in Japanese Laid-Open Patent Application H8-78396 is known as a dry etching technique for the fine working of a conductor film formed from one of these electrode materials.

With this technique (hereinafter referred to as the conventional etching method), a ruthenium film or ruthenium oxide film on a silicon substrate is selectively etched using a plasma of a halogen gas (fluorine gas, chlorine gas, iodine gas) or a mixed gas of a hydrogen halide gas and oxygen gas (or ozone gas).

The techniques discussed in Japanese Laid-Open Patent Applications H6-283438 and H9-246214 are known as techniques for forming a film of ruthenium oxide or the like. The former technique involves depositing a ruthenium oxide film with a low resistivity value on the surface of a substrate such as silicon by MOCVD (Metal Organic Chemical Vapor Deposition) using dipivaloyl methanate ruthenium as the raw material. The latter technique involves stably depositing a ruthenium film or a ruthenium oxide film on a substrate surface by MOCVD using liquid or vaporized 2,2,6,6-trimethyl-3,5-heptanedione ruthenium as the raw material.

Known publication in which other related technology is discussed include Japanese Laid-Open Patent Application 2000-200782.

SUMMARY OF THE INVENTION

The conventional etching methods discussed above, however, do not deal with avoiding the damage to the substrate caused by the plasma. Moreover, the resist mask is also etched by the oxygen-based gas contained in the etching gas, which makes it very difficult to form the proper circuit pattern. Furthermore, a plasma etching apparatus is quite costly, and using one of the above conventional etching methods leads to higher cost in the manufacture of a semiconductor device.

In view of this, it is an object of the present invention to provide a method for manufacturing a semiconductor device, with which a semiconductor device having at least one type of conductor film selected from among a ruthenium film, a ruthenium oxide film, an osmium film, and an osmium oxide film can be manufactured inexpensively and at a high level of quality.

To achieve the stated object, the present invention is constituted such that when at least one type of conductor film selected from among a ruthenium film, a ruthenium oxide film, an osmium film, and an osmium oxide film is etched, impurities containing carbon are removed from the conductor film prior to this etching.

This allows a semiconductor device with excellent quality to be manufactured at a low cost.

BRIEF DESCRIPTION OF THE DRAWINGS

These and other features, objects, and advantages of the present invention will become more apparent from the following description when taken in conjunction with the accompanying drawings, wherein.

DESCRIPTION OF THE PREFERRED EMBODIMENTS

An embodiment of the present invention will now be described through reference to the appended drawings. In the description that follows, the term "ruthenium oxide" refers collectively to $RuO$, $RuO_2$, $RuO_3$, and $RuO_4$, and "osmium oxide" refers collectively to $OsO$, $Os_2O_3$, $OsO_2$, $OsO_3$, and $OsO_4$.

Let us first discuss the fine working conditions in the semiconductor process, obtained as a result of trial and error through experimentation.

First, a number of samples for use in the experiment are produced by the following procedure.

Figure 2:
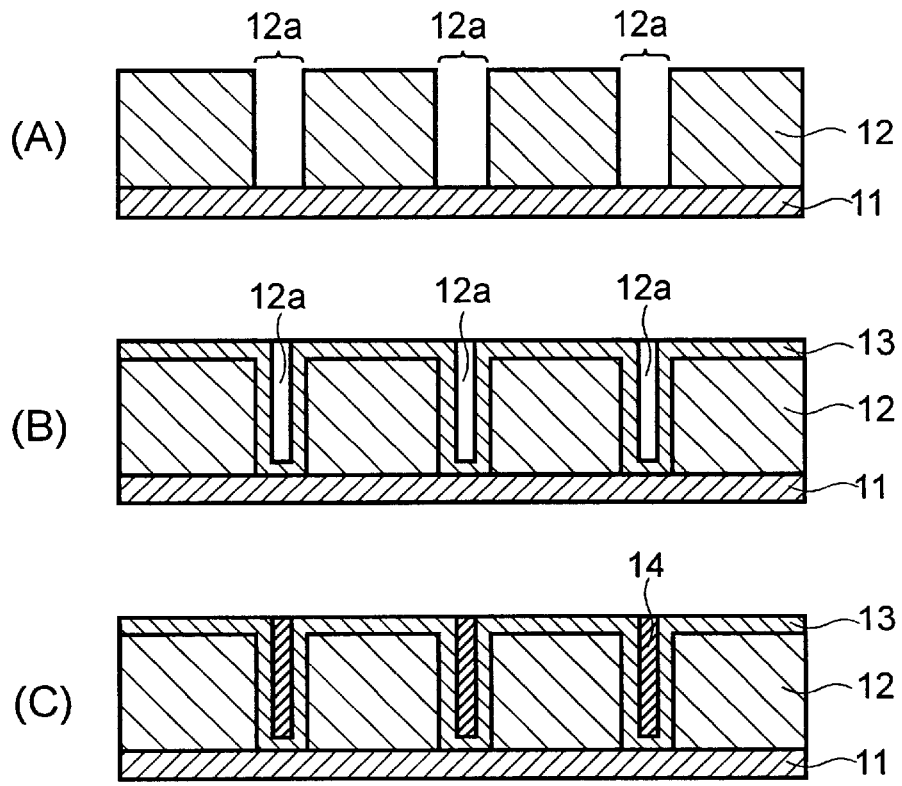
FIG. 2 consists of diagrams of the steps of producing the sample used in an experiment for finding the fine working conditions pertaining to an embodiment of the present invention.

As shown in FIG. 2A, a silicon oxide film 12 is formed on the surface of each silicon wafer 11 by a thermal oxidation process. A number of holes 12a are formed over the silicon wafer 11 by patterning the silicon oxide film 12 by anisotropic dry etching. Next, ruthenium is deposited by CVD, which forms a ruthenium film 13 on the top surface of the silicon oxide film 12 and on the inner walls of the holes 12a, as shown in FIG. 2B. Then, as shown in FIG. 2C, the holes 12a are filled with the resist 14, after which this product is left unwashed for a suitable length of time in the air. This completes the samples used in the following experiment.

The ruthenium films and resists of a number of samples randomly selected from among those produced above are etched under various temperature conditions with an etching gas containing 5 volt % ozone generated by silent discharge from an ozonizer. More specifically, a sample is placed in the etching treatment chamber of an etching apparatus, and etching gas containing 5 volt % ozone is introduced at a flux of 10 slm into the treatment chamber while the wafer temperature is monitored. The pressure conditions employed here are 100 Torr and 700 Torr.

Figure 1:
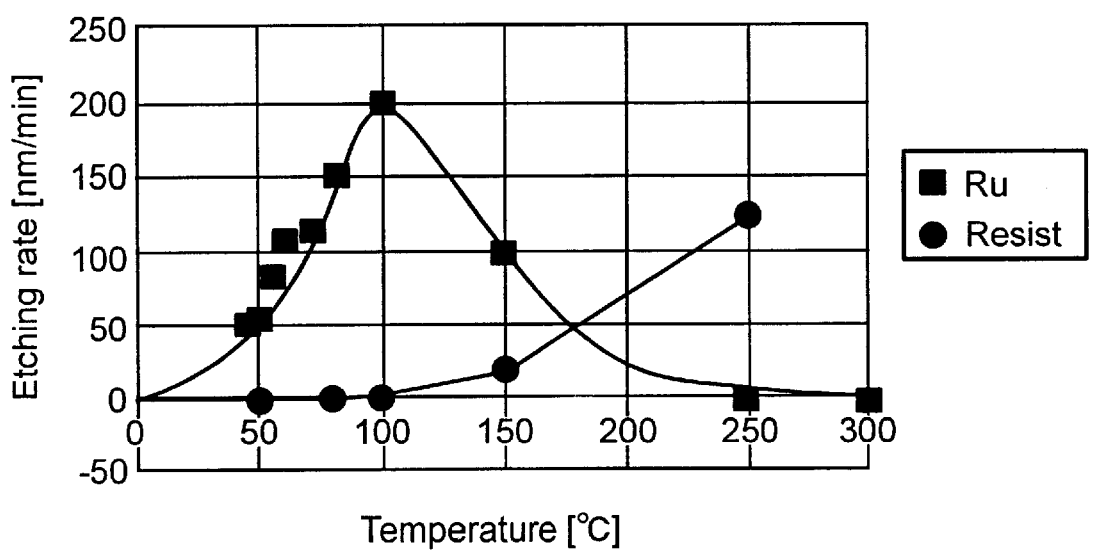
FIG. 1 is a graph of the temperature dependence of the etching rate of a resist and ruthenium with ozone.

The characteristic X-ray intensities of the ruthenium film and resist pattern of each sample are then measured with a fluorescent X-ray analyzer, and the etching rates calculated from these measurement values are plotted on a graph (horizontal axis: temperature). This is how the graph in FIG. 1 was obtained.

As is clear from this graph, the ruthenium film of the sample is etched at wafer temperatures ranging approximately between 20° C. and 350° C., and the peak to the etching rate (200 nm/min) appears near a wafer temperature of 100° C. The reason the ruthenium film is etched so quickly at such a low temperature is believed to be that ozone decomposition is accelerated by the catalytic action of ruthenium, and $RuO_4$ with a high vapor pressure is generated even at a low temperature. The higher the wafer temperature, the lower the ruthenium film etching rate, the reason for which is believed to be that thermodynamically stable $RuO_2$ is formed on the ruthenium film surface.

Meanwhile, it can be seen from this same graph that the etching rate of the resist pattern of the sample is only about 1 nm/min at best when the wafer temperature is about 100° C. or lower, and increases sharply when the wafer temperature goes over about 100° C., exceeding the etching rate of the ruthenium film in the vicinity of a wafer temperature of 175° C.

Furthermore, the etching selectivity ratio of ruthenium versus resist and the etching selectivity ratio of resist versus ruthenium were calculated, which revealed the etching selectivity ratio of ruthenium versus resist to be at least 100 at a low wafer temperature of about 100° C. or lower, and the etching selectivity ratio of resist versus ruthenium to be at least 100 at a high wafer temperature over 250° C. Specifically, it was found that at a low wafer temperature between 20° C. and 100° C., just the ruthenium is etched, with almost no resist being etched, whereas at a high wafer temperature of about 250° C. or higher, just the resist is etched, with almost no ruthenium being etched.

The same experiment as above was also conducted for ruthenium oxide, osmium, and osmium oxide, and as a result the same tendencies as with ruthenium were noted.

Furthermore, when the same experiment as above was conducted using an etching gas containing either an oxygen halogenide, a nitrogen oxide, or oxygen atoms instead of an etching gas containing ozone, the same tendencies were confirmed as when the etching gas containing ozone was used.

Specifically, it was confirmed that if the gas is an oxygen atom-donative gas whose free energy becomes negative during the reaction, then $RuO_4$ or $OsO_4$, which have a high vapor pressure even at low pressure, will be generated, and the same tendencies as above will be exhibited.

The etch-back of ruthenium, ruthenium oxide, osmium, and osmium oxide generally requires that (1) a high etching rate be achieved in order to ensure a good throughput, and (2) a high selectivity ratio versus the resist be obtained. Based on the above findings, from the standpoint of (1) ensuring good throughput, it is preferable for the wafer temperature to be approximately between 30° C. and 200° C., and from the standpoint of (2) ensuring a high selectivity ratio versus the resist, it is preferable for the wafer temperature to be approximately 100° C. or lower.

In view of this, in this embodiment a temperature of approximately between 30° C. and 100° C., which satisfies the above two conditions (1) and (2), was employed as the wafer temperature in the etching treatment, and a temperature of approximately 250° C. or higher, at which just the resist is etched and the ruthenium, etc., are substantially unaffected, was employed as the wafer temperature in the resist removal treatment following the etching treatment.

Figure 3:
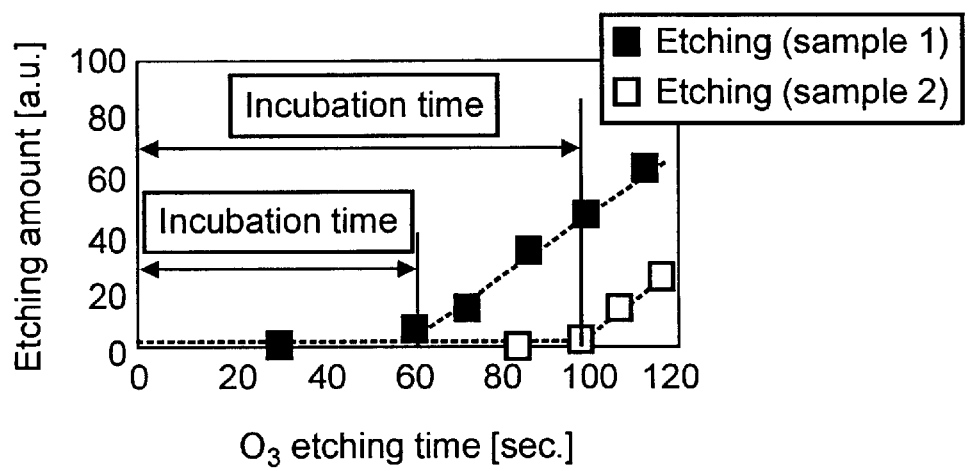
FIG. 3 is a graph of the relationship between the elapsed time from the start of ozone supply and the amount of ruthenium etching.

A further requirement in the etch-back of ruthenium, ruthenium oxide, osmium, and osmium oxide is (3) that uniform etching be possible within the wafer plane. However, it was found that when the ruthenium films of a number of randomly selected samples were etched under the same etching conditions, as shown in FIG. 3, there is variance in the incubation time (the time it takes from the start of ozone supply until the start of ruthenium etching) between these samples.

The same experiment was conducted for a ruthenium oxide film, an osmium film, and an osmium oxide film, which confirmed that there is variance in the incubation time between samples.

In an effort to learn the cause of this variance, the gas released under heating from the surface of the unetched ruthenium film was analyzed, whereupon CH-based gas was detected. This means that impurities containing carbon, such as positive resist residue (cyclic isoprene rubber, etc.) and developing solution residue (tetramethylammonium hydride, cresol, etc.), are adhering to or being deposited on the ruthenium film surface. The presence of these impurities is believed to hinder the etching reaction.

In view of this, in this embodiment we further examined (1) utilizing desorption through heating and (2) utilizing desorption through a chemical reaction in order to remove such impurities down to a level at which they would not hinder the etching reaction of a ruthenium film, etc.

Figure 4:
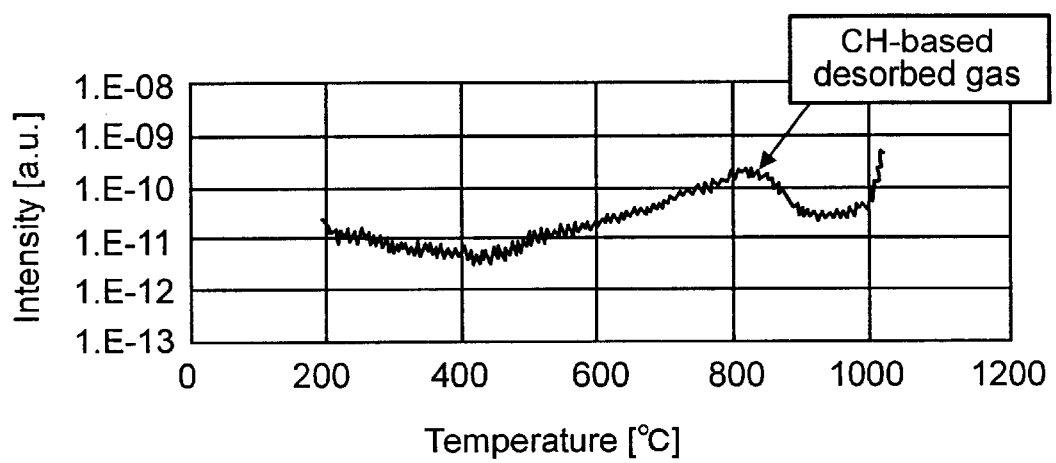
FIG. 4 is a graph of the relationship between the heat treatment temperature for a ruthenium surface layer, and the concentration of gas desorbed from the ruthenium surface layer.

First, to study the use of desorption through heating (1), the inventors heated the ruthenium film of a sample and examined the relationship between the heating temperature of the ruthenium film and the concentration of CH-based gas generated from the surface of this film. As a result, as shown in FIG. 4, the concentration of CH-based gas generated from the ruthenium film surface was found to increase until the heating temperature reached about 800° C. Therefore, it was found that the heating treatment must be performed at approximately 800° C. or higher if the impurities are to be thoroughly desorbed from the ruthenium film surface. Nevertheless, heating a substrate to a temperature of about 800° C. or higher cannot be considered practical from the standpoints of the thermal budget with respect to the device, preventing resist modification, and so on.

Next, to study the use of desorption through a chemical reaction, the inventors examined the change over time in the contact angle at the surface of the various ruthenium films by subjecting the ruthenium films of the samples to various treatments entailing chemical reaction (①) treatment with $O_2$ gas excited by irradiation with ultraviolet rays (wavelength of 400 nm or less) (hereinafter referred to as UV irradiated $O_2$ gas treatment), ② treatment with $N_2$ gas excited by irradiation with ultraviolet rays (hereinafter referred to as UV irradiated $N_2$ gas treatment), ③ organic solvent wet etching treatment with a ketone-based organic solvent, an alcohol-based organic solvent, sulfuric acid, hydrogen peroxide, methanol, or an organic alkali developer prior, and ④ ultrasonic treatment) at a suitable wafer temperature and at atmospheric pressure or lower.

Figure 5:
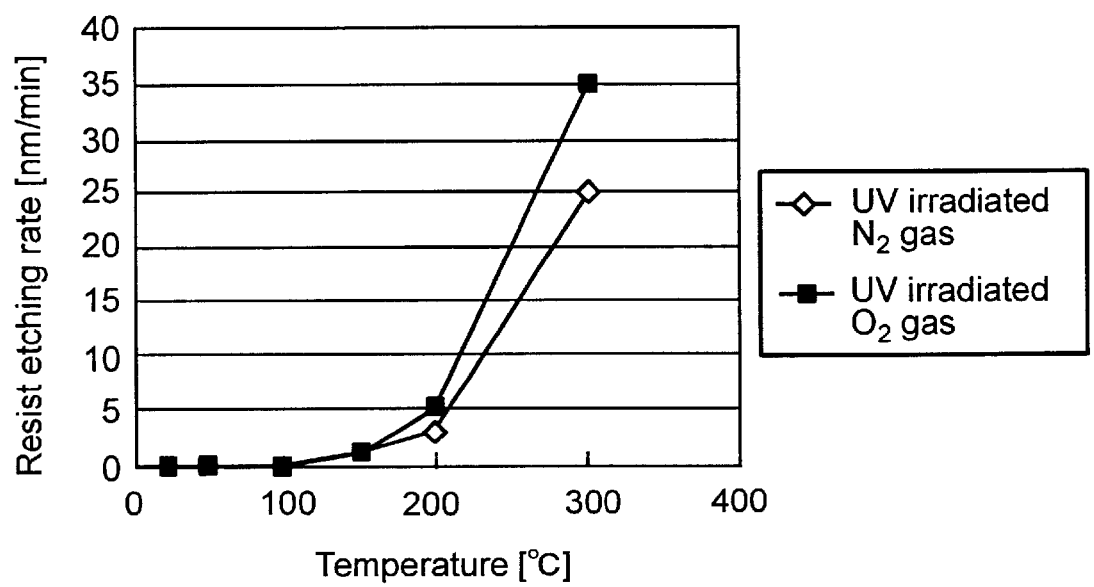
FIG. 5 is a graph of the relationship between the treatment temperature and the resist etching rate with UV irradiated $N_2$ gas, and of the relationship between the treatment temperature and the resist etching rate with UV irradiated $O_2$ gas.

The "suitable wafer temperature" referred to above is a temperature of 200° C. or lower, at which enough energy for desorption from the ruthenium film[1] can be imparted to the impurities. The reason the wafer temperature is limited to 200° C. or lower is that the resist etching rate was examined ahead of time using UV irradiated $O_2$ gas treatment and UV irradiated $N_2$ gas treatment at various wafer temperatures, and as a result, as shown in FIG. 5, it was found that the higher is the wafer temperature, the greater is the etching rate, and furthermore, the rate of increase in the etching rate rises sharply near a wafer temperature of 200° C.

Figures 6, 7:
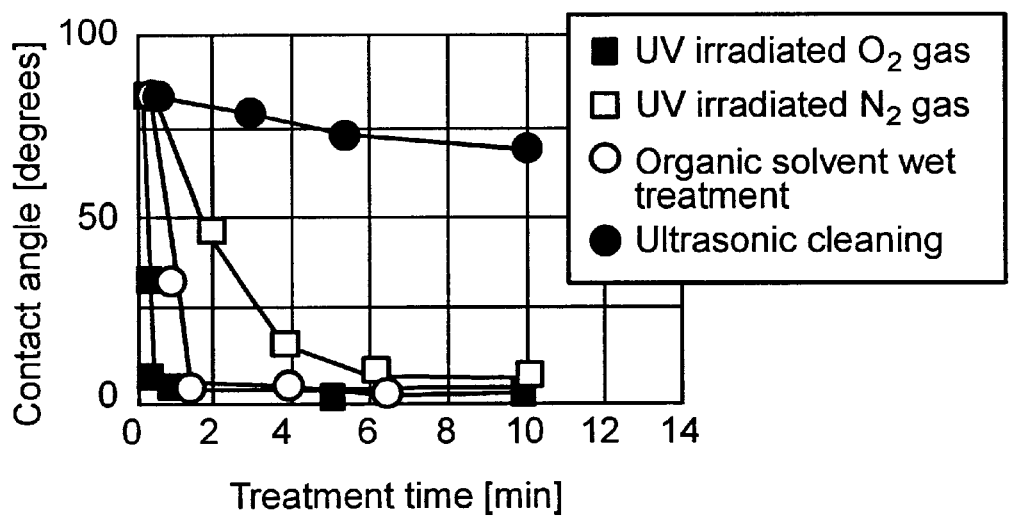
FIG. 6 is a graph illustrating the effect of removing impurities from the ruthenium surface layer by treatment with UV irradiated $O_2$ gas, treatment with UV irradiated $N_2$ gas, wet treatment with an organic solvent, and ultrasonic cleaning.
FIG. 7 is a table for deciding the suitability of UV irradiated $O_2$ gas treatment, UV irradiated $N_2$ gas treatment, and organic solvent wet treatment as a pretreatment method for ruthenium etching.

The change over time in the contact angle at the surface of various ruthenium films was examined, and as a result, as shown in FIG. 6, a reduction in contact angle was noted at the surface of the ruthenium films that underwent the three treatments other than the ultrasonic treatment (the UV irradiated $O_2$ gas treatment, UV irradiated $N_2$ gas treatment, and organic solvent wet etching treatment), and it was confirmed that the impurity removal effect was sufficient to bring the carbon on the ruthenium film down to a monolayer (number of carbons on the conductor film: 0 to approximately $1 \times 10^{15}$ atoms/cm$^2$).

If impurities can be removed to this extent, they will not hinder the etching reaction significantly. Furthermore, the effect that these three treatments have on the ruthenium film and the resist was examined, which confirmed that the etching rate of the resist exceeded 100 nm/min with just the organic solvent wet etching treatment, meaning that there is a high probability that the resist will be etched along with the impurities, as shown in FIG. 7.

In contrast, with the UV irradiated $O_2$ gas treatment and UV irradiated $N_2$ gas treatment, it was confirmed that the etching rate for both the ruthenium film and the resist can be kept to a suitable value through temperature control, and that the ruthenium film surface undergoes no pronounced modification. Similar results were obtained for a ruthenium oxide film, osmium film, and osmium oxide film, just as with the ruthenium film.

The impurity removal effect of other gases was also examined, which revealed that a UV irradiated nitrogen oxide gas, oxygen gas excited by electromagnetic waves (such as microwaves) (hereinafter referred to as electromagnetically excited oxygen gas), nitrogen gas excited by electromagnetic waves (hereinafter referred to as electromagnetically excited nitrogen gas), and nitrogen oxide gas excited by electromagnetic waves (hereinafter referred to as electromagnetically excited nitrogen oxide gas) also have an impurity removal effect similar to that of UV irradiated $O_2$ gas and UV irradiated $N_2$ gas.

As a result of the above investigation, it was found that (2) the use of desorption through a chemical reaction, and particularly the use of a UV irradiated $O_2$ gas, UV irradiated $N_2$ gas, UV irradiated nitrogen oxide gas, electromagnetically excited oxygen gas, electromagnetically excited nitrogen gas, or electromagnetically excited nitrogen oxide gas, which have little effect on the resist or on the ruthenium film, etc., is preferred as the treatment for removing impurities from the surface of a ruthenium film, etc., prior to etch-back.

Figure 8:
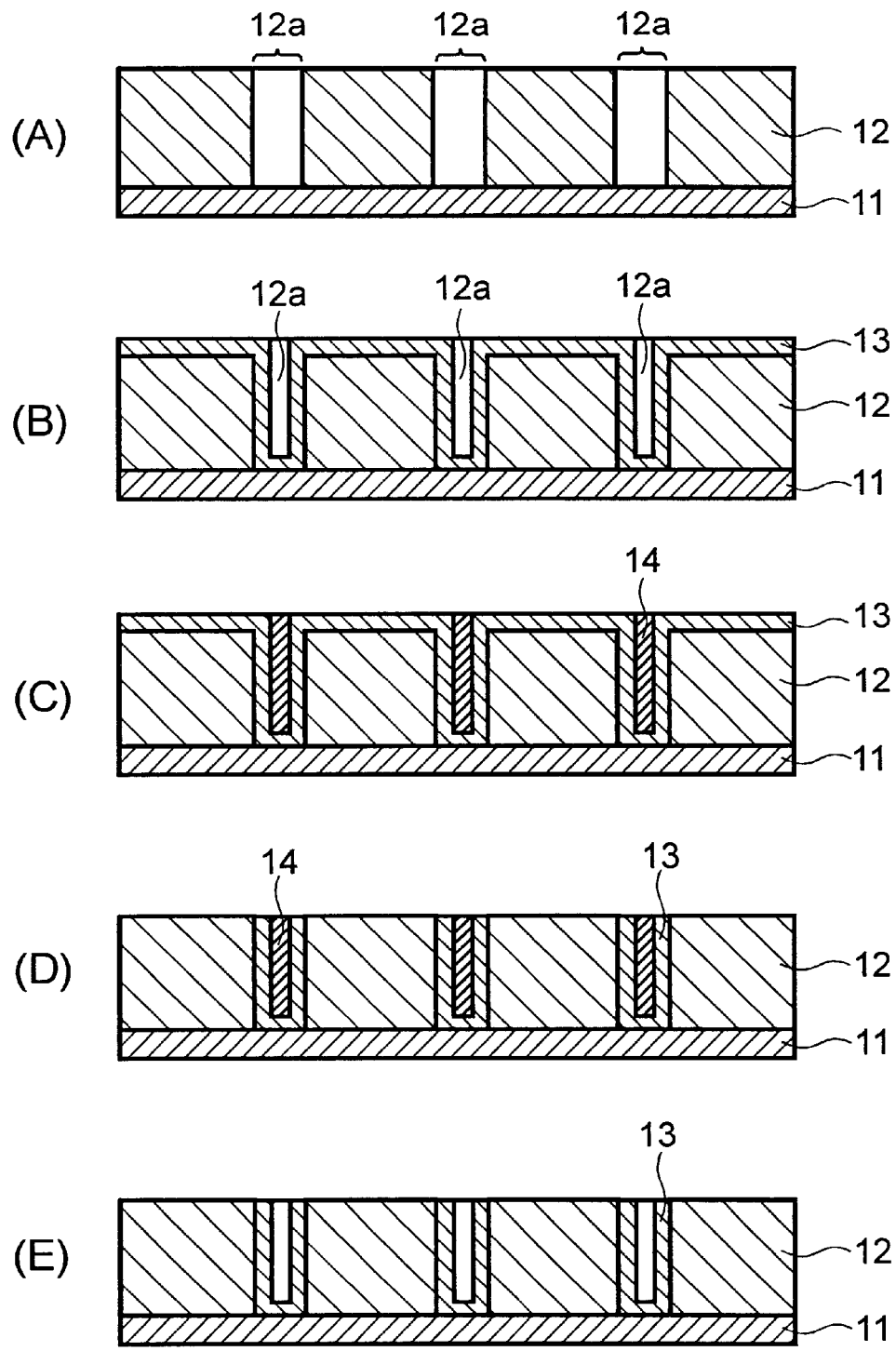
FIG. 8 consists of diagrams illustrating the process of manufacturing a semiconductor device pertaining to an embodiment of the present invention.

Next, we will describe a semiconductor [manufacturing] process using the fine working conditions obtained above. The fine working conditions obtained above can be applied to the [manufacturing] process for an entire semiconductor device, including memory elements, TFT (Thin Film Transistor) elements, and other such elements, but the example given here is of application of the above fine working conditions to a contact plug formation step. The treatment involved in this contact plug formation step will be described through reference to FIGS. 8 and 9.

As shown in FIG. 8A, a silicon oxide film 12 is formed on the surface of a silicon wafer 11 by thermal oxidation film formation. Holes 12a are formed by patterning this silicon oxide film 12 by anisotropic dry etching. Next, a conductor material (either ruthenium oxide, osmium, osmium oxide, or ruthenium) is deposited by CVD. As shown in FIG. 8B, this forms a conductor film (either a ruthenium oxide film, osmium film, osmium oxide film, or ruthenium film) 13 on the upper surface of the silicon oxide film 12 and on the inner wall surfaces of the holes 12a, and as shown in FIG. 8C, the holes 12a are filled with a resist 14.

Figure 9:
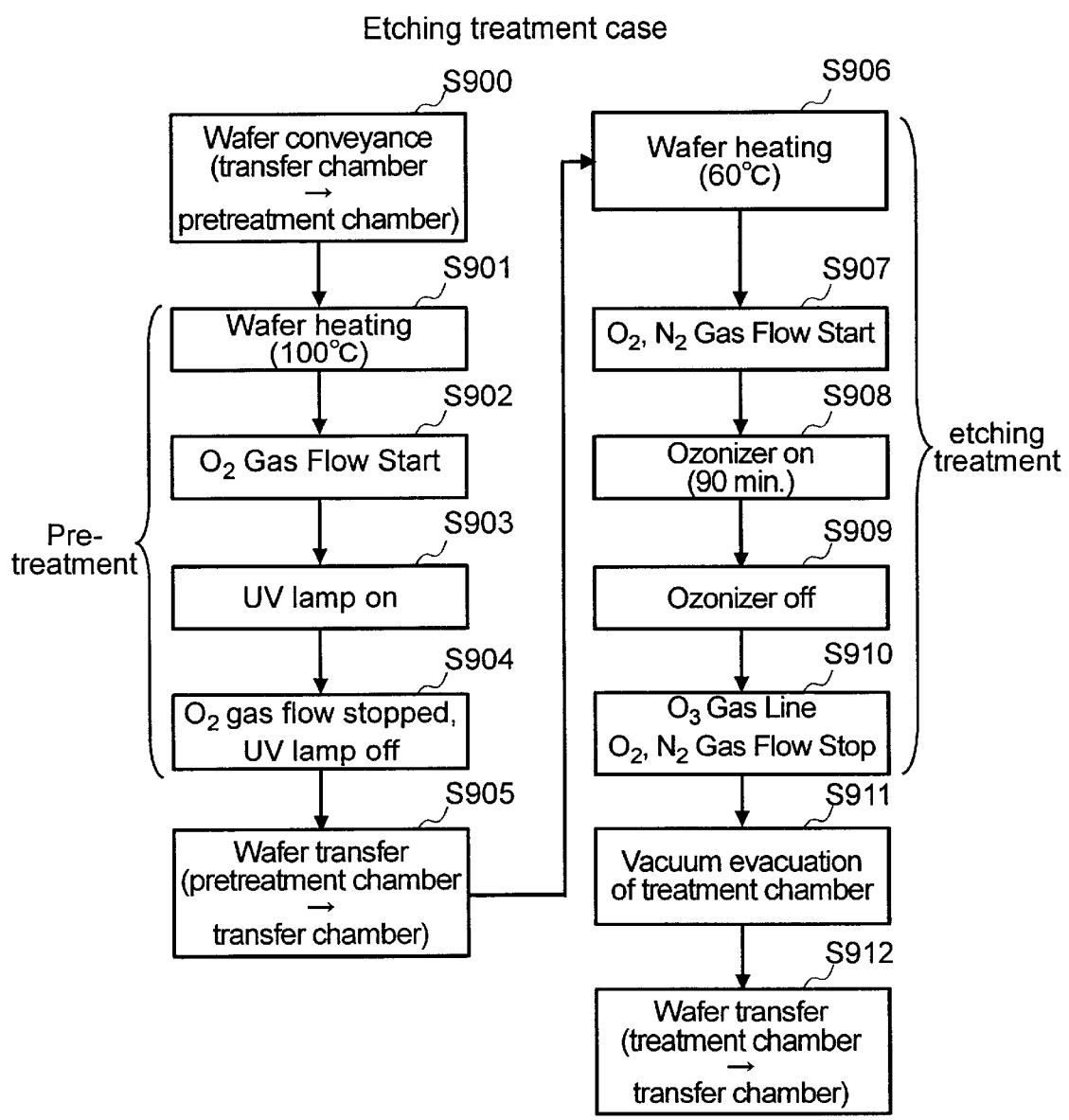
FIG. 9 is a flow chart of the fine working used in the semiconductor device manufacturing process pertaining to an embodiment of the present invention.

After this, an etching treatment is carried out according to the sequence in FIG. 9, as discussed below.

The silicon wafer 11 is transferred to a pretreatment chamber (S900), and pretreatment (S901 to S904) is carried out in the pretreatment chamber according to the conditions discussed above, so that impurities are removed from the surface of conductor film 13 prior to etch-back pretreatments. Specifically, the silicon wafer 11 is heated to 200° C. or lower (about 100° C. here) (S901), after which a low pressure mercury vapor UV lamp is flashed while oxygen gas is supplied to the silicon wafer surface at atmospheric pressure or below (S902 and S903), and after enough time has elapsed for the carbon on the conductor film to become a monolayer (number of carbons on the conductor film: no more than $1 \times 10^{15}$ atoms/cm$^2$), the supply of oxygen gas and the flashing of the low pressure mercury vapor UV lamp are halted (S904).

A low pressure mercury vapor UV lamp was used here for the UV irradiation lamp, buy an excimer lamp, metal halide lamp, or high pressure mercury vapor lamp may be used instead of the low pressure mercury vapor UV lamp.

Once any impurities that would hinder etching have been removed from the surface of the conductor film 13 by carrying out this pretreatment (S901 to S904), the silicon wafer 11 is transferred from the pretreatment chamber to an etching chamber (S905). An etching treatment is begun according to the above conditions inside the etching chamber (S906 to S908). Specifically, the silicon wafer is heated to a temperature of about 30° C. or higher but no higher than 100° C. (about 60° C. here, at which a suitable selectivity ratio with respect to the resist is obtained) (S906), after which silent discharge is performed with an ozonizer while oxygen gas and nitrogen gas are supplied.

The etching gas thus obtained, which contains 5 vol % ozone, is supplied at a flux of 10 slm to the silicon wafer surface for about 90 minutes while the pressure inside the etching chamber is regulated. As a result, just the conductor film 13 is etched with ozone, and the resist is substantially unaffected (S907 and S908). Because the etching reaction of the conductor film 13 here begins substantially simultaneously with the supply of ozone, the incubation time can be substantially ignored.

Once the conductor film 13 has been removed to the point that the silicon oxide film 12 is exposed as shown in FIG. 8D while the etching progress is monitored, the wafer temperature is raised to about 250° C. or higher. This removes just the resist 14 inside the holes 12a, substantially without affecting the conductor film 13, and completes the contact plug 13 [sic] shown in FIG. 8E.

After this, the silent discharge of the ozonizer is halted (S909), and the supply of oxygen gas and nitrogen gas is halted (S910). The interior of the etching chamber is then vacuum evacuated to purge the exhaust gas from the etching chamber (S911), and the silicon wafer 11 is transferred from the etching chamber (S912).

Thus, with the contact plug formation method pertaining to this embodiment, merely by controlling the wafer temperature, it is possible to etch a conductor film such as ruthenium with ozone, substantially without affecting the resist, and then to remove just the unnecessary resist, substantially without affecting the ruthenium or other conductor film. Also, since impurities containing carbon are removed in advance from the surface of the ruthenium or other conductor film, this ruthenium or other conductor film can be etched more uniformly. This has been confirmed by measuring the ruthenium etching rate by the sequence in FIG. 9, which revealed that the variance within the wafer plane had been kept to about ±5%, which poses no practical problem.

The etching performed in the contact plug formation method pertaining to this embodiment is not plasma etching, which can cause etching damage to the silicon wafer or the ruthenium or other film, but rather utilizes a chemical reaction between ozone and the various constituent molecules of the material surface layer in a high-energy state produced by externally supplied heat (hereinafter referred to as non-plasma etching).

Because it does not generate an ion sheath, this non-plasma etching treatment subjects the silicon wafer 11 and the ruthenium or other conductor film 13 to substantially no etching damage. Furthermore, a remote plasma treatment, in which a plasma gas generated somewhere away from the etching site is brought in through a pipe,[2] is also encompassed by the non-plasma etching treatment that can be applied to the contact plug formation method pertaining to this embodiment because although it does make use of a plasma, it does not generate an ion sheath.

Also, because there is no need to use an expensive plasma etching apparatus, the cost of manufacturing a semiconductor device can be kept down.

Moreover, a corrosive gas is not used as the etching gas, which prevents the corrosion and so forth of the metal components of the etching apparatus.

Figure 10:
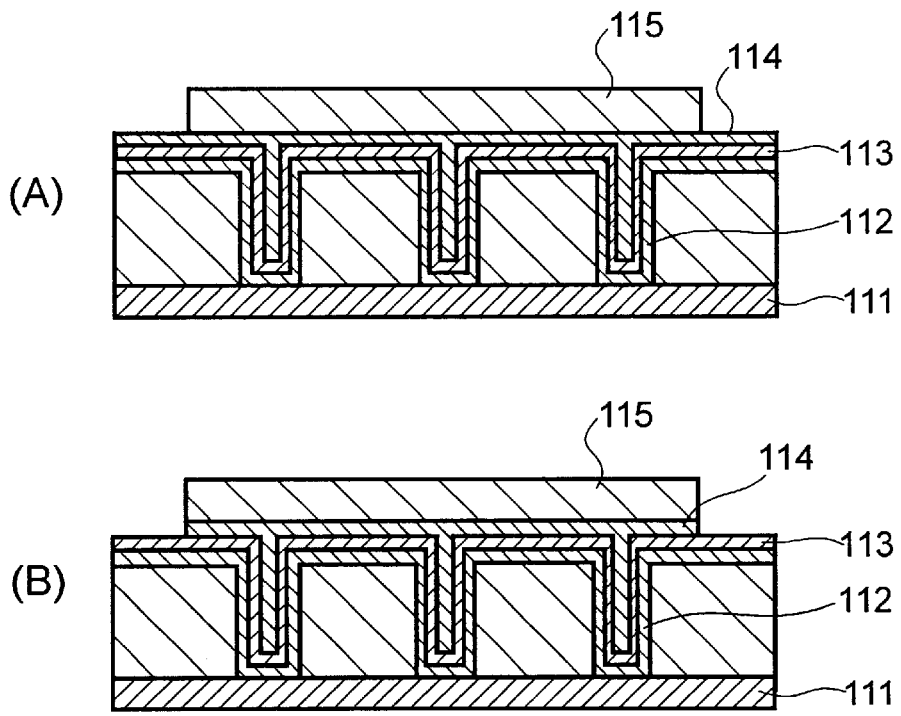
FIG. 10 consists of diagrams illustrating the process of manufacturing a semiconductor device pertaining to an embodiment of the present invention.

The example used above was of the application of the above-mentioned fine working conditions to a contact plug formation step, but as mentioned above, these fine working conditions can also be applied to another semiconductor process. For instance, it can be applied to the formation of the upper electrode of a capacitor in a memory cell. The application of the above-mentioned fine working conditions in the formation of the upper electrode of a capacitor will now be described through reference to FIG. 10. Of the ruthenium, ruthenium oxide, osmium, and osmium oxide discussed above, the example given here will be for when ruthenium is used as the electrode material.

As shown in FIG. 10A, a capacitor lower electrode 112, a dielectric film 113, a ruthenium capacitor upper electrode 114, and a resist mask pattern 115 are formed in that order on a silicon substrate 111. After this, the ruthenium capacitor upper electrode 114 is etched according to the sequence in FIG. 9.

More specifically, after impurities are removed from the surface layer of the ruthenium capacitor upper electrode 114 by the same treatment as in the pretreatment discussed above (S901 to S904), just the ruthenium capacitor upper electrode 114 is etched uniformly with an etching gas containing 5 vol % ozone by the same treatment as in the etching treatment discussed above (S906 to S910). Etching with ozone is isotropic etching, but as long as the aspect ratio of the pattern is 0.2 or less, it can be formed with good precision.

Once the ruthenium capacitor upper electrode 114 has been removed to the point that the dielectric film 113 is exposed as shown in FIG. 10B while the etching progress is monitored, the wafer temperature is raised to about 250° C. or higher. This removes just the resist 115, substantially without affecting the ruthenium capacitor upper electrode 114 patterned in the specified shape, and completes the capacitor.

Thus, again when the above-mentioned fine working conditions are applied to the formation of a capacitor upper electrode, just as in the formation of a contact plug discussed above, merely by controlling the wafer temperature, it is possible to uniformly etch just the ruthenium with ozone, substantially without affecting the resist, and then to remove just the unnecessary resist, substantially without affecting the ruthenium. Furthermore, the silicon wafer 111 and the ruthenium film 114 are subjected to substantially no damage, and the corrosion and so forth of the metal components of the etching apparatus can be prevented. Naturally, because there is no need to use an expensive plasma etching apparatus, the cost of manufacturing a semiconductor device can also be kept down.

A silicon wafer was used as the substrate in the two examples given above, but the fine working conditions pertaining to this embodiment can be applied to a process that makes use of a semiconductor substrate other than a silicon wafer, an insulating substrate, or another substrate. Also, an ozone-containing gas was used as the etching gas in the two examples given above, but another gas capable of donating oxygen atoms to the material surface layer (such as a gas containing an oxygen halogenide, a nitrogen oxide, or oxygen atoms) can be used instead as the etching gas. Also, UV irradiated nitrogen gas, UV irradiated nitrogen oxide gas, oxygen gas excited by electromagnetic waves (such as microwaves), electromagnetically excited nitrogen gas, or electromagnetically excited nitrogen oxide gas may be used instead of the UV irradiated oxygen gas in the etch-back pretreatment.

Finally, we will describe the structure of the etching apparatus suited to a semiconductor [manufacturing] process to which the fine working conditions pertaining to this embodiment are applied. The apparatus structure when an etching gas containing ozone is used will be given as an example here, and when an etching gas containing an oxygen halogenide, a nitrogen oxide, or oxygen atoms is used, suitable modifications should be made to the apparatus structure described herein.

Figure 11:
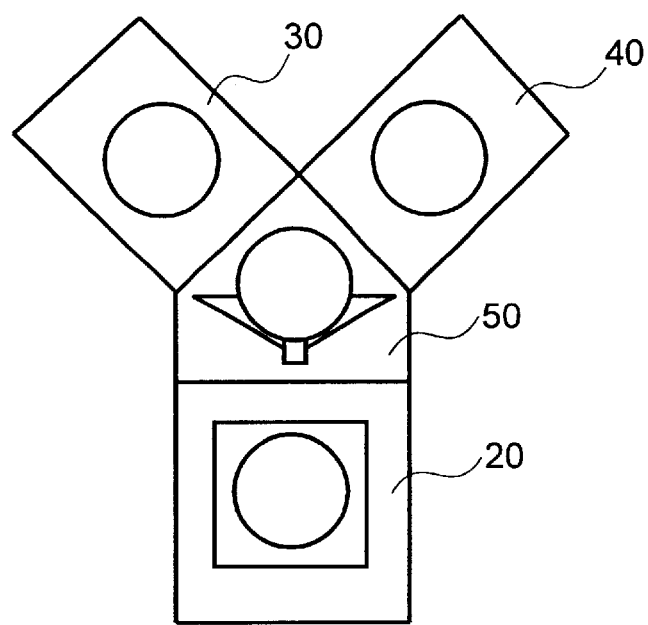
FIG. 11 is a simplified diagram of the structure of the etching apparatus pertaining to an embodiment of the present invention.

As shown in FIG. 11, the etching apparatus pertaining to this embodiment has a load lock chamber 20, an etching chamber 30, a pretreatment chamber 40, and a transfer chamber 50 that connects these three chambers. The transfer chamber 50 allows the substrates being transferred from the load lock chamber 20 to the pretreatment chamber, from the pretreatment chamber to the etching chamber 30, and from the pretreatment chamber 40 to a specified location to pass through.

Figure 12:
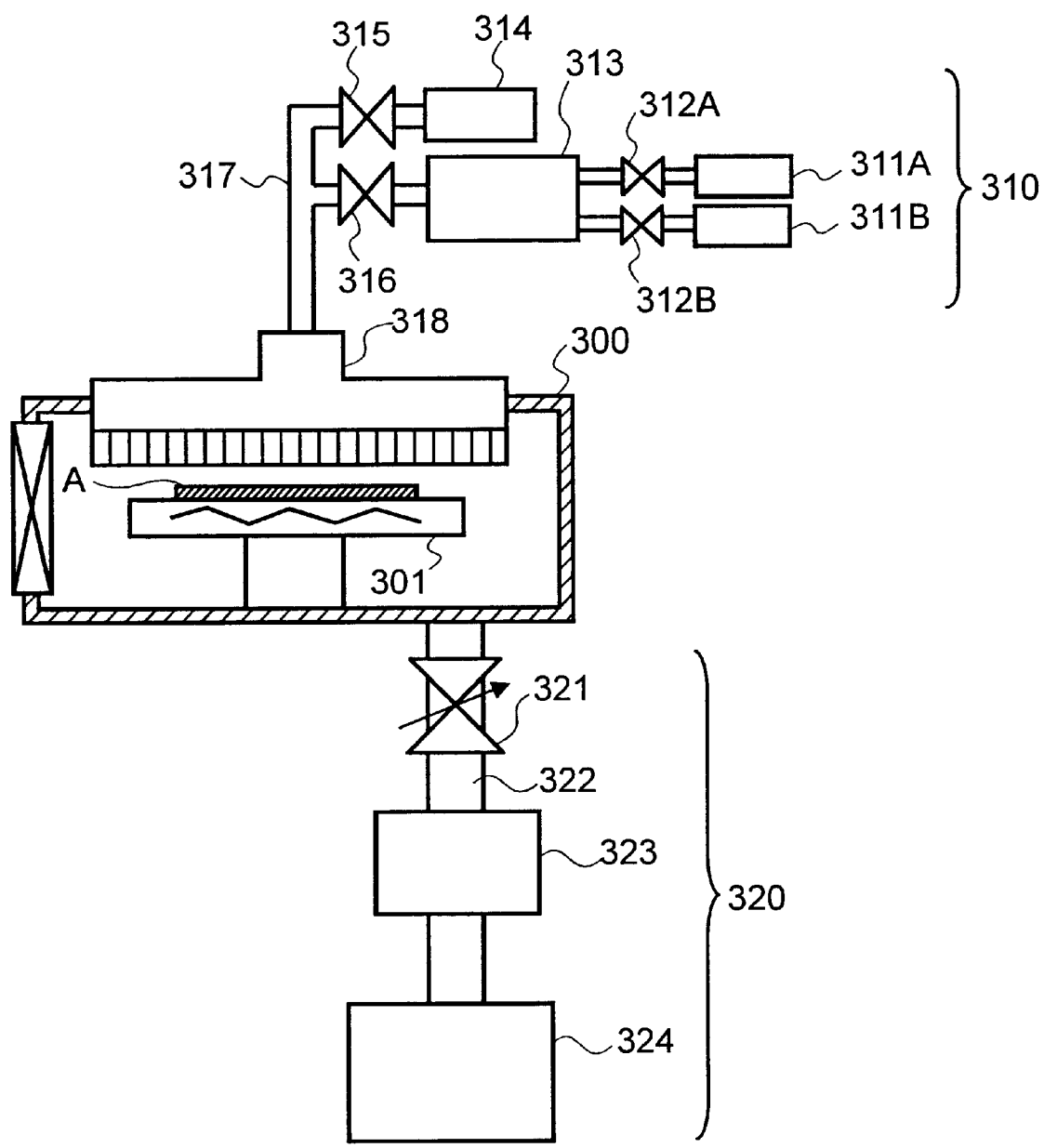
FIG. 12 illustrates an example of the structure of the etching chamber in FIG. 11.

As shown in FIG. 12, the etching chamber 30 has a susceptor 301 for holding a substrate A while it is heated, an etching chamber 300 in which the susceptor 301 is housed, a gas supply unit 310 for supplying the etching gas into the etching chamber 300, and an exhaust unit 320 for the vacuum evacuation of the inside of the etching chamber 300.

The gas supply unit 310 comprises an ozonizer 313 for performing silent discharge, an oxygen supplier 311A equipped with oxygen to be supplied to the ozonizer 313, a nitrogen supplier 311B equipped with nitrogen to be supplied to the ozonizer, a pipe equipped with a flux regulator valve 312A for guiding the oxygen from the oxygen supplier 311A to the ozonizer 313, a pipe equipped with a flux regulator valve 312B for guiding the nitrogen from the nitrogen supplier 311B to the ozonizer 313, a shower head 318 attached to the upper inside part of the etching chamber 300, a nitrogen supplier 314 equipped with nitrogen for adjusting the ozone concentration, a pipe 317 equipped with flux regulator valves 315 and 316 for guiding a mixed gas of the nitrogen from the nitrogen supplier 314 and the ozone from the ozonizer 313 to the shower head 318, and so forth.

The exhaust unit 320 comprises a vacuum pump 323, a pipe 322 equipped with a pressure regulating conductance valve 321 that links the vacuum pump 323 with the interior of the etching chamber 300, a treatment unit 324 for treating the ozone and so on discharged from the vacuum pump 323, and so forth.

The structure of the pretreatment chamber 40 varies with the type of gas used for the pretreatment. For example, if UV irradiated oxygen gas, UV irradiated nitrogen gas, or UV irradiated nitrogen oxide gas is used for the pretreatment, then as shown in FIG. 13, the pretreatment chamber 40 comprises a susceptor 401 for holding a substrate A while it is heated, a pretreatment chamber 400 in which the susceptor 401 is housed, a shower head 406 provided to the upper inside part of the pretreatment chamber, an oxygen supplier 402 equipped with oxygen to be supplied to the shower head 406, a pipe 404 equipped with a flux regulator valve 403 for guiding the oxygen from the oxygen supplier 402 to the shower head 406, a UV irradiation lamp 405 (such as a low pressure mercury vapor UV lamp, excimer lamp, metal halide lamp, or high pressure mercury vapor lamp) for irradiating the gas passing through the shower head 406 with ultraviolet rays, a pipe 408 for discharging the gas inside the pretreatment[3] chamber 400, a treatment unit 407 for treating the ozone and so on discharged from the pretreatment chamber 400 through the pipe 408, and so forth.

Figure 13:
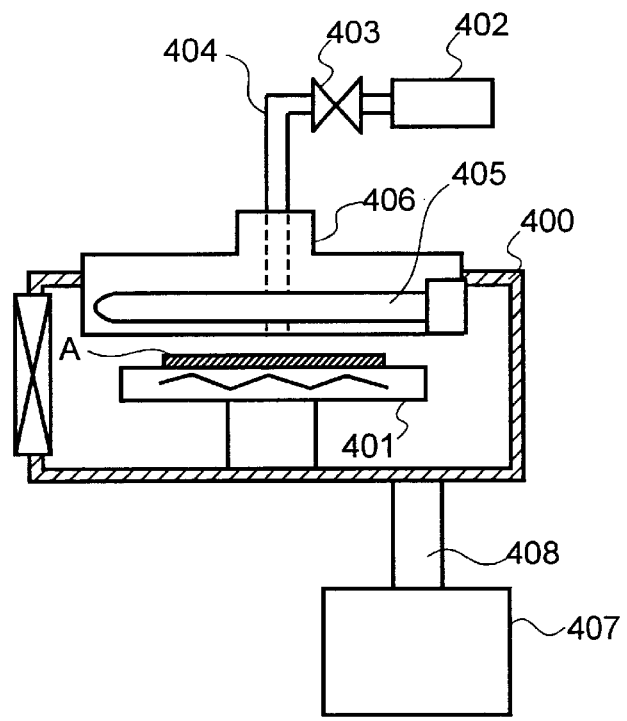
FIG. 13 illustrates an example of the structure of the pretreatment chamber in FIG. 11.
Figure 14:
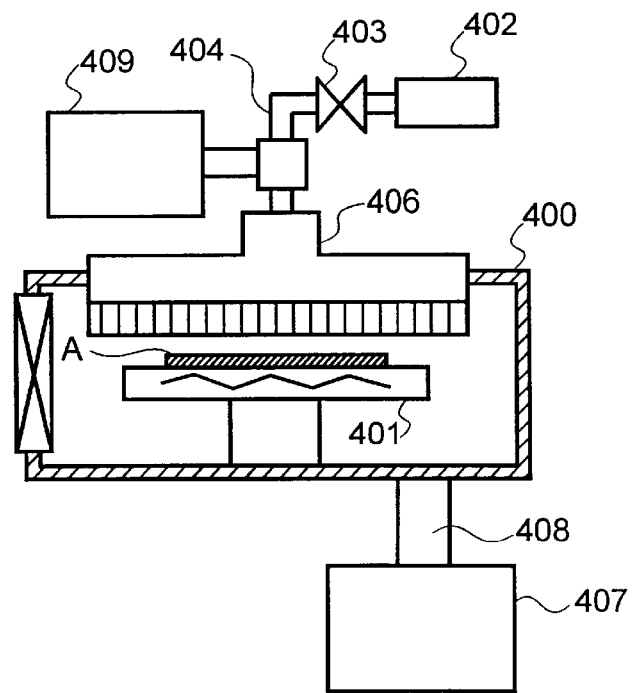
FIG. 14 illustrates another example of the structure of the pretreatment chamber in FIG. 11.

In contrast, when an electromagnetically excited oxygen gas, an electromagnetically excited nitrogen gas, or an electromagnetically excited nitrogen oxide gas is used for the pretreatment, then as shown in FIG. 14, a microwave generator 409 for irradiating the oxygen passing through the pipe 404 with microwaves must be installed instead of the UV irradiation pipe 405 in FIG. 13.

While we have shown and described several embodiments in accordance with our invention, it should be understood that disclosed embodiments are susceptible of changes and modifications without departing from the scope of the invention. Therefore, we do not intend to be bound by the details shown and described herein, but intend to cover all such changes and modifications that fall within the ambit of the appended claims.

What is claimed is:

1. A method for manufacturing a semiconductor device, comprising an etching treatment for working a conductor film formed on a substrate, wherein, when the conductor film is one of a ruthenium film, a ruthenium oxide film, an osmium film, and an osmium oxide film, and the method includes a pretreatment in which impurities containing carbon are removed from the conductor film prior to the etching treatment.

2. The method for manufacturing a semiconductor device according to claim 1, wherein the pretreatment includes irradiating a gas containing oxygen, nitrogen, or a nitrogen oxide with ultraviolet rays or electromagnetic waves, and supplying the gas to a surface of a substrate prior to the etching treatment.

3. The method for manufacturing a semiconductor device according to claim 1, wherein, when there is a resist adhered to the substrate, and the substrate is maintained at about 200° C. or lower during the pretreatment.

4. The method for manufacturing a semiconductor device according to claim 1, wherein the pretreatment includes bringing the conductor film into contact with at least one of a solution of a ketone-based organic solvent, an alcohol-based organic solvent, sulfuric acid, hydrogen peroxide, methanol, or an organic alkali developer, prior to the etching.

5. The method for manufacturing a semiconductor device according to claim 1, wherein the pretreatment brings any carbon at the surface of the conductor film to a concentration below $1 \times 10^{15}$ atoms/cm$^2$.

6. The method for manufacturing a semiconductor device according to claim 1, wherein, in the etching treatment following the pretreatment, an etching gas containing at least one member of the group consisting of hydrogen halides, nitrogen oxides, an oxygen atoms is supplied to the substrate after the pretreatment.

7. A method for working a conductor film, in which a conductor film selected from among a ruthenium film, a ruthenium oxide film, an osmium film, and an osmium oxide film is etched, and wherein said working method includes a pretreatment in which impurities containing carbon are substantially removed from the conductor film prior to the etching.

8. A method for treating a solid substrate, comprising the steps of:

conveying a substrate having a film including at least one member of the group consisting of ruthenium, ruthenium oxide, osmium, and osmium oxide to a pretreatment chamber;

performing a pretreatment involving the removal of carbon containing impurity molecules that are on the substrate;

conveying the substrate from the pretreatment chamber to a treatment chamber;

supplying an etching gas containing at least one gas selected from the group consisting of ozone, oxygen halogenides, nitrogen oxides, and oxygen atoms to the treatment chamber, and etching the film on the substrate; and removing the etched substrate from the treatment chamber.

* * * * *